United States Patent
Lee et al.

(10) Patent No.: US 8,795,932 B2
(45) Date of Patent: Aug. 5, 2014

(54) METHOD OF FABRICATING A POLARIZED COLOR FILTER

(75) Inventors: Si-Chen Lee, Taipei (TW); Fang-Tzu Chuang, Taipei (TW); Yu-Wei Jiang, New Taipei (TW); Hung-Hsin Chen, Taipei (TW)

(73) Assignee: National Taiwan University, Taipei (TW)

( * ) Notice: Subject to any disclaimer, the term of this patent is extended or adjusted under 35 U.S.C. 154(b) by 63 days.

(21) Appl. No.: 13/531,479

(22) Filed: Jun. 22, 2012

(65) Prior Publication Data

US 2013/0244145 A1    Sep. 19, 2013

(30) Foreign Application Priority Data

Mar. 16, 2012 (TW) .............................. 101109167 A (51) Int. Cl.
*G03F 1/00* (2012.01)
*G03F 7/00* (2006.01)

(52) U.S. Cl.
USPC .................................... 430/7; 430/5; 430/394

(58) Field of Classification Search
USPC ................................................. 430/5, 7, 394
See application file for complete search history.

(56) References Cited

U.S. PATENT DOCUMENTS

| | | | |
|---|---|---|---|
| 7,491,892 B2 * | 2/2009 | Wagner et al. | 174/254 |
| 2008/0233489 A1 * | 9/2008 | Blanchet et al. | 430/5 |
| 2010/0015535 A1 * | 1/2010 | Song et al. | 430/5 |
| 2013/0065162 A1 | 3/2013 | Lee et al. | |

* cited by examiner

*Primary Examiner* — Stewart Fraser
(74) *Attorney, Agent, or Firm* — Huffman Law Group, PC (57) ABSTRACT

A method of fabricating a polarized color filter wherein a transparent substrate is provided and coated with a photoresist layer. A wave-shaped mask may then be prepared and a periodic wave-shaped surface may be placed in contact with the photoresist layer, treating the photoresist layer with a primary exposure process. An external force may be applied to the wave-shaped mask, and the transparent substrate or wave-shaped mask by be rotated by a predetermined degree. The photoresist layer may be treated with a secondary exposure process, wherein the photoresist layer is developed in order to obtain a photoresist pattern layer. A metal layer may be coated on the transparent substrate with the photoresist pattern layer. The photoresist pattern layer and the portion of the metal layer on the photoresist pattern layer may then be removed such that the remaining metal layer forms a periodic hole substrate.

26 Claims, 6 Drawing Sheets

METHOD OF FABRICATING A POLARIZED COLOR FILTER

CROSS-REFERENCE TO RELATED APPLICATION(S)

This application claims priority from Taiwan Patent Application No. 101109167, filed on Mar. 16, 2012, the disclosure of which is hereby incorporated by reference herein in its entirety.

BACKGROUND

1. Field of the Invention

The present disclosure generally relates to a photolithography process, and more particularly, to a method of manufacturing a micron-scaled or nano-scaled periodic hole structure.

2. Description of the Related Art

In order to increase device densities and speeds while reducing the power consumption required of these devices through continuously miniaturizing integrated circuit processes, the semiconductor industry has reached the generation of nano-scaled devices by degree. Recently, research of nano materials has become a very important subject. Based on the effects of nano scale, some scholars have begun investigating the properties of various materials in nano scale, such that nano-scaled structures in different dimensions, such as nano dots, nano wires, nano tubes, nano pillars, nano rings, nano rods, and nano films have been prepared to study the associated characteristics.

Although materials in nano scale have special physical and chemical properties, they may be affected relatively easily by an external force. Hence, how to prepare a large area of nano-scaled structures with the same size precisely is a challenge that needs to be overcome in order to research of the properties of nano-scaled structures. Many process technologies of various nano scales, such as ultra-low wavelength developing technology, dipping high-refractive-index liquid interference developing technology, e-beam developing technology, and nano imprint technology have been developed for manufacturing nano-period structures.

However, these technologies are costly and a process capable of producing a very small size pattern in a nano-period structure is time consuming. Therefore, there is a need for another technology to provide a large area of a nano-structured pattern.

SUMMARY

In an embodiment, a method of fabricating a polarized color filter is provided. The method comprises the process elements of providing a transparent substrate, in which the transparent substrate is coated with a photoresist layer, preparing a wave-shaped mask, in which the wave-shaped mask having a periodic wave-shaped surface and a plate-shaped surface opposite to the periodic wave-shaped surface, making the periodic wave-shaped surface be in contact with the photoresist layer, treating the photoresist layer with a primary exposure process to obtain a first exposure zone, applying an external force to the wave-shaped mask for leading the wave-shaped mask to be deformed, rotating the transparent substrate by a predetermined degree, treating the photoresist layer with a secondary exposure process to obtain a second exposure zone, developing the photoresist layer to obtain a photoresist pattern layer, coating a metal layer on the transparent substrate with the photoresist pattern layer, and removing the photoresist pattern layer and the portion of metal layer on the photoresist pattern layer such that the remaining metal layer forms a periodic hole structure.

In an embodiment, a method of fabricating a polarized color filter is provided. The method comprises the process elements of providing a transparent substrate, in which the transparent substrate is coated with a photoresist layer, preparing a wave-shaped mask, in which the wave-shaped mask having a periodic wave-shaped surface and a plate-shaped surface opposite to the periodic wave-shaped surface, making the periodic wave-shaped surface be in contact with the photoresist layer, treating the photoresist layer with a primary exposure process to obtain a first exposure to zone, applying an external force to the wave-shaped mask for leading the wave-shaped mask to be deformed, rotating the wave-shaped mask by a predetermined degree, treating the photoresist layer with a secondary exposure process to obtain a second exposure zone, developing the photoresist layer to obtain a photoresist pattern layer, coating a metal layer on the transparent substrate with the photoresist pattern layer, and removing the photoresist pattern layer and the portion of metal layer on the photoresist pattern layer such that the remaining metal layer forms a periodic hole structure.

In some embodiments, the advantages of the fabrication method of the polarized color filter are simple and rapid. The cost and time consumed for manufacturing the large-area polarized color filter can be reduced significantly.

The foregoing is a summary and shall not be construed to limit the scope of the claims. The operations and devices disclosed herein may be implemented in a number of ways, and such changes and modifications may be made without departing from this disclosure and its broader aspects. Other aspects, inventive features, and advantages of the disclosure, as defined solely by the claims, are described in the non-limiting detailed description set forth below.

DETAILED DESCRIPTION OF EMBODIMENTS

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present disclosure. It is to be understood that elements not specifically shown or described may take various forms known to those skilled in the art.

Further, when a layer is referred to as being on another layer or "on" a substrate, it may be directly on the other layer or on the substrate, or intervening layers may also be present.

FIGS. 1A through 1H are cross-sectional views illustrating process elements of fabricating a polarized color filter in accordance with an embodiment of the present disclosure. It is to be noted that the fabrication method for the polarized color filter of the present disclosure may comprise other process elements and components, but in order to simplify the figures and descriptions, only exemplary elements are depicted and described, and such depictions and descriptions are not restrictive of the scope of the present disclosure.

In conjunction with FIGS. 1A through 1H, FIG. 2A illustrates a flow chart of a process of fabricating the polarized color filter in accordance with an embodiment of the present disclosure.

Figure 1A:
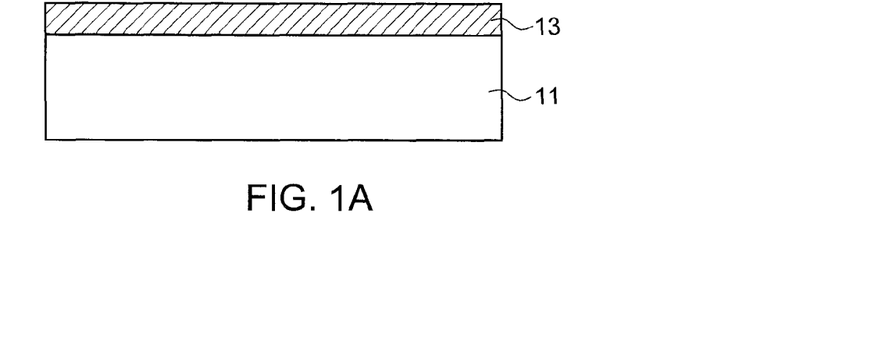
FIGS. 1A through 1H are cross-sectional views illustrating the process elements of fabricating a polarized color filter in accordance with an embodiment of the present disclosure.

Referring to FIG. 1A, a transparent substrate 11 is provided (S201). The transparent substrate 11 may allow infrared light (IR) or visible light to penetrate. For example, the transparent substrate 11 may be a silicon (Si) wafer, a germanium (Ge) wafer, or a glass substrate. In an embodiment, the transparent substrate 11 may be an n-type double-side polished silicon wafer which allows IR to penetrate. Next, the transparent substrate 11 is coated with a photoresist layer 13 (S203). The material of the photoresist layer 13 may be positive photoresist or negative photoresist. The thickness of the photoresist layer 13 is approximately 100~4000 nanometers (nm).

Figure 1B:
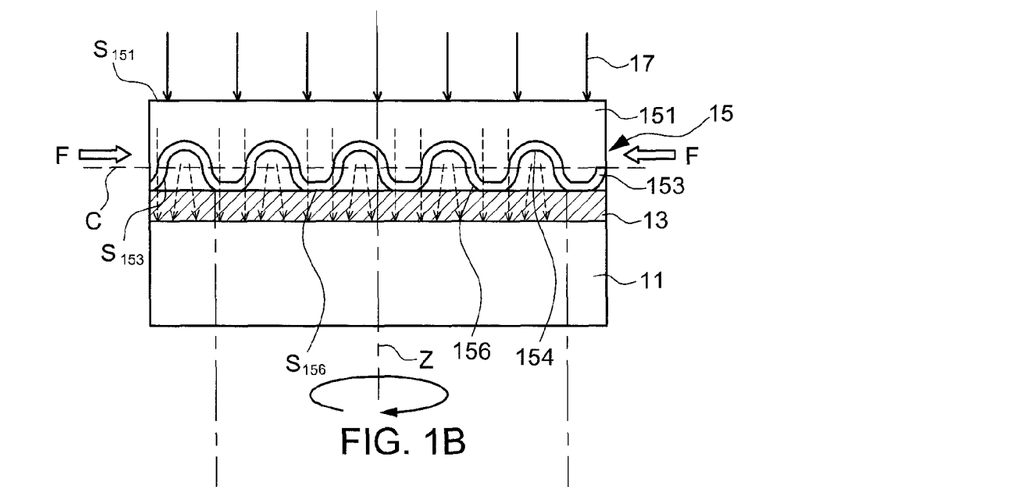

As shown in FIG. 1B, a wave-shaped mask 15 is prepared (S205). The wave-shaped mask 15 may comprise an elastomeric transparent substrate 151 and a light-penetrable thin film layer 153. The material of the elastomeric transparent substrate 151 may be a transparent polymeric elastomer comprising Polydimethylsiloxane (PDMS), Polyimide (PI), etc. The material of the light-penetrable thin film layer 153 may be a metal thin film layer or an oxide thin film layer. In particular, the Young's modulus of the light-penetrable thin film layer 153 may be larger than the Young's modulus of the elastomeric transparent substrate 151. In other words, the coefficient of compressibility of the light-penetrable thin film layer 153 is different from the coefficient of compressibility of the elastomeric transparent substrate 151. In an embodiment, the light-penetrable thin film layer 153 is a metal thin film layer comprising aurum (gold, Au), argentum (silver, Ag), or alloy of them having Young's modulus between 80~120 GPa, or comprising Pt or other alloy with the lower elasticity having Young's modulus between 120-180 GPa. In an alternative embodiment, the light-penetrable thin film layer 153 is an oxide thin film layer comprising at least one of silicon dioxide ($SiO_2$), zinc oxide (ZnO) and aluminum oxide ($Al_2O_3$) having Young's modulus between 90-150 GPa.

The wave-shaped mask 15 may have a periodic wave-shaped surface $S_{153}$ and a plate-shaped surface $S_{151}$ opposite to the periodic wave-shaped surface $S_{153}$. The period of the periodic wave-shaped surface $S_{153}$ is approximately between 300 nm and 25 micrometers (μm). The method of fabricating the wave-shaped mask 15 may refer to U.S. patent application Ser. No. 13/424,119, which is incorporated by reference herein.

In an embodiment, the thickness of the elastomeric transparent substrate 151 may be between approximately 0.5~10 millimeters (mm). The thickness of the light-penetrable thin film layer 153 may be between approximately 5-15 nm. The thickness of the light-penetrable thin film layer 153 may be so thin that it allows ultraviolet (UV) or visible light to penetrate. The thickness and the material of the light-penetrable thin film layer 153 may affect the period and the amplitude of the periodic wave-shaped surface $S_{153}$. For example, the thinner the light-penetrable thin film layer 153, the smaller the period of the periodic wave-shaped surface $S_{153}$.

Referring to FIG. 1B, the periodic wave-shaped surface $S_{153}$ of the wave-shaped mask 15 is in contact with the photoresist layer 13 (S207). Since the wave-shaped mask 15 is an elastomer, the contact portions of the periodic wave-shaped surface $S_{153}$ tends to be a smooth plate when the periodic wave-shaped surface $S_{153}$ of the wave-shaped mask 15 is in contact with the photoresist layer 13. Specifically, if looking at a cross-section of the light-penetrable thin film layer 153, the portions above the axis c are regarded as a plurality of concaves 154, and the portions below the axis c are regarded as a plurality of convexes 156, and the part of each convex 156 of the periodic wave-shaped surface $S_{153}$ is smoothed to be a smooth plate $S_{156}$ that is matched with the upper surface of the photoresist layer 13.

Figure 1C:
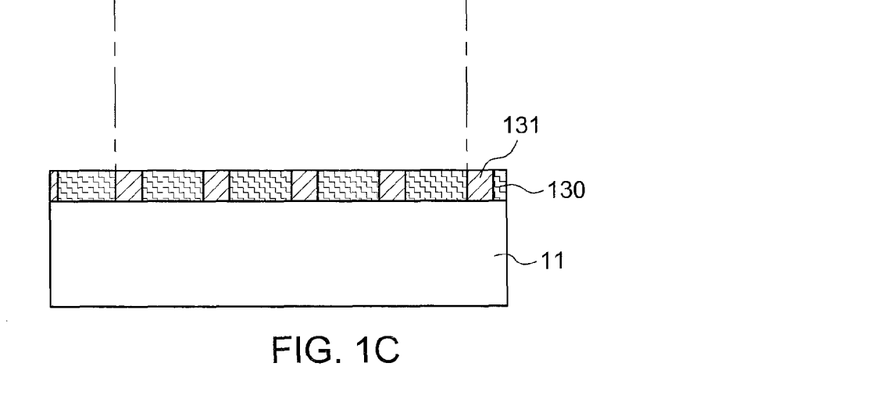

Next, the photoresist layer 13 is treated with a primary exposure process (S209) by exposing the plate-shaped surface $S_{151}$ of the wave-shape mask 15 to a light source 17 after the wave-shaped mask 15 is aligned and in contact with the photoresist layer 13. The light source 17 may be UV light or visible light. When the light source 17 passes through the wave-shaped mask 15, the part of light may pass through the smooth plate $S_{156}$ without reflection, and the other part of the light may be scattered from the concave 154. In other words, each concave 154 of the light-penetrable thin film layer 153 may be regarded as a concave lens. The light intensity passing through the smooth plate $S_{156}$ of the convexes 156 is thereby more than the light intensity passing through the concaves 154 to change the bonding strength of the portions of the photoresist layer 13 under the smooth plate $S_{156}$ of the convexes 156. Accordingly, a first exposure zone 131 and an unexposure zone 130 are formed after the primary exposure process as shown in FIG. 1C.

It is to be noted that the comparison between the light intensity from the concaves 154 and the light intensity from the convexes 156 may be enhanced by increasing the amplitude of the wave-shaped surface $S_{153}$ of the light-penetrable thin film layer 153 to improve the exposure efficiency.

Referring to FIG. 1B, a stable external force F is applied to the wave-shaped mask 15 (S211) continuously via a stage device (not shown). The strength of the external force F would not exceed the limit of elasticity of the wave-shaped mask 15 for leading the wave-shaped mask 15 to be deformed along one dimension. The external force F may be an extending force or a pressing force. In one embodiment, the process element of applying the external force F may comprise applying two opposite forces along the horizontal axis parallel to the plate-shaped surface $S_{151}$ of the wave-shape mask 15 to the wave-shape mask 15 for extending or pressing the wave-shape mask 15 to change the period of the wave-shaped surface $S_{153}$ of the wave-shape mask 15.

Next, the transparent substrate 11 coated with the photoresist layer 13 is rotated about the central axis Z vertical to the transparent substrate 11 by a predetermined degree (S213). The predetermined degree may be approximately equal to 90 degrees. In an embodiment, the process element of applying the external force F to the wave-shape mask 15 (S211) and the process element of rotating the transparent substrate 11 (S213) may be swapped or performed at the same time.

Figure 1D:
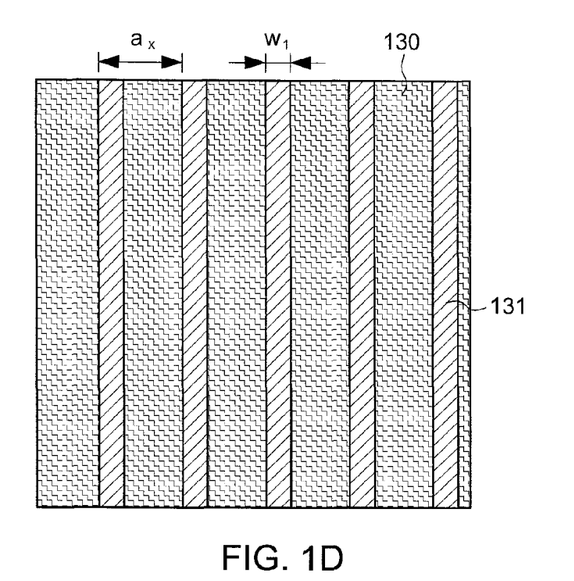

FIG. 1D illustrates a top view of the transparent substrate 11 from FIG. 1B in accordance with an embodiment of the present disclosure. As shown in FIG. 1D, the photoresist layer comprises positive photoresist in this embodiment. The photoresist layer 13 comprises the first exposure zone 131 after the first primary exposure process is performed. The line width $w_1$ of the exposure zone 131 is approximately equal to the width of the smooth plate $S_{156}$ of the convexes 156 and is between approximately 100 nm and 24 μm. Further, a first period $a_x$ of the first exposure zone 131 is approximately equal to the period of the wave-shaped surface $S_{153}$ of the light-penetrable thin film layer 153 and is between approximately 300 nm and 25 μm.

Figure 1E:
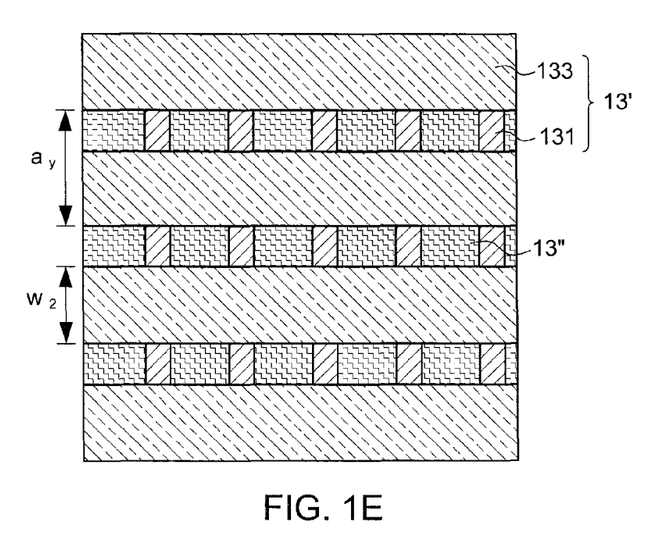

After the period of the wave-shaped surface $S_{153}$ of the wave-shape mask 15 is adjusted during the process element S211, for example, the period is increased, and the transparent substrate 11 is rotated by the predetermined degree. For example, the determined degree is equal to 90 degrees, and the photoresist layer 13 patterned into the first exposure zone 131 is treated with a second exposure process (S215). As shown in FIG. 1E, like the primary exposure process during the process element 5209, a second exposure zone 133 is formed, where the second exposure zone 133 is orthogonal to the first exposure zone 131. A photoresist pattern zone 13' is thereby obtained which consists of the first exposure zone 131 and the second exposure zone 133. The line width $w_2$ of the second exposure zone 133 may be larger than the line width $w_1$ of the first exposure zone 131. Further, the second period $a_y$ of the second exposure zone 133 may be larger than the first period $a_x$ of the first exposure zone 131. The second period $a_y$ is between approximately 400 nm and 30 μm.

Figure 1F:
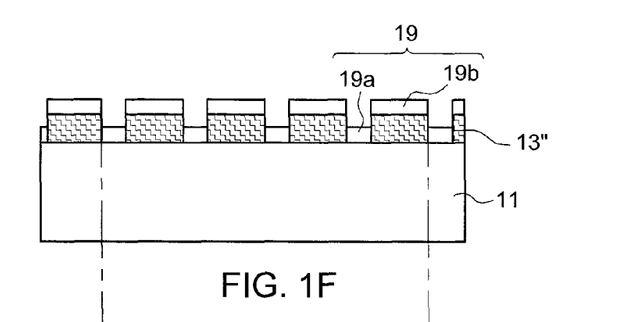

After the photoresist pattern zone 13' is obtained, the photoresist layer 13 is treated with a developing process such that a photoresist pattern layer 13" is obtained (S217). The structure of the photoresist pattern layer 13" may be a periodic rectangular structure. Next, a metal layer 19 is coated on the transparent substrate 11 on which the photoresist pattern layer 13" is disposed (S219). As shown in FIG. 1F, the metal layer 19 comprises a first metal layer 19a disposed on the transparent substrate 11 and a second metal layer 19b disposed on the photoresist pattern layer 13". The metal layer 19 comprises at least one of argentum (Ag), aurum (Au) and aluminum (Al). The metal layer 19 may be obtained by evaporation or sputtering, where the sputtering may be plasma sputtering, RF sputtering, dual cathodes sputtering, magnetron sputtering, or ion beam sputtering. The thickness of the metal layer 19 may be between approximately 30 nm and 200 nm.

Figure 1G:
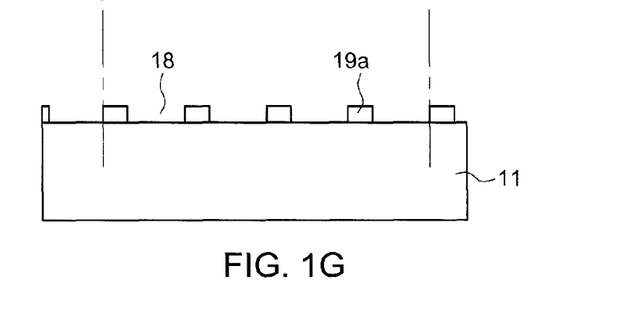

Finally, the photoresist pattern layer 13" and the second metal layer 19b disposed on the photoresist pattern layer 13" are removed by using an organic solvent, such as Acetone (S221). The photoresist pattern layer 13" and the second metal layer 19b are thereby lifted off from the transparent substrate 11, while the first metal layer 19a remains on the transparent substrate 11. Accordingly, a periodic hole structure 18 is formed on the transparent substrate 11 for allowing visible light and IR light to penetrate. In particular, the periodic hole structure 18 is a periodic rectangular hole structure, as shown in FIG. 1G.

Figure 1H:
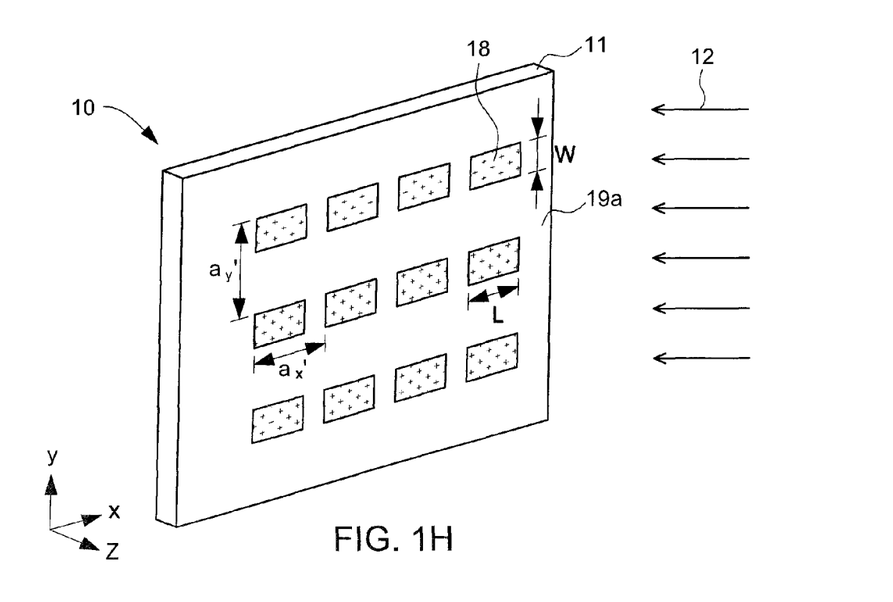

FIG. 1H illustrates a perspective view of the transparent substrate 11. The transparent substrate 11 with the periodic rectangular hole structure 18 formed by the above-mentioned process elements may be regarded as a polarized color filter 10. The length L of the periodic rectangular hole structure 18 may be between approximately 200 nm and 20 μm. The width W of the periodic rectangular hole structure 18 may be between approximately 50 nm and 20 μm. The x-axis period $a_x'$ of the periodic rectangular hole structure 18 may be approximately equal to the first period $a_x$ of the first exposure zone 131, and the y-axis period $a_y'$ of the periodic rectangular hole structure 18 may approximately equal to the second period $a_y$ of the second exposure zone 133.

Figure 2A:
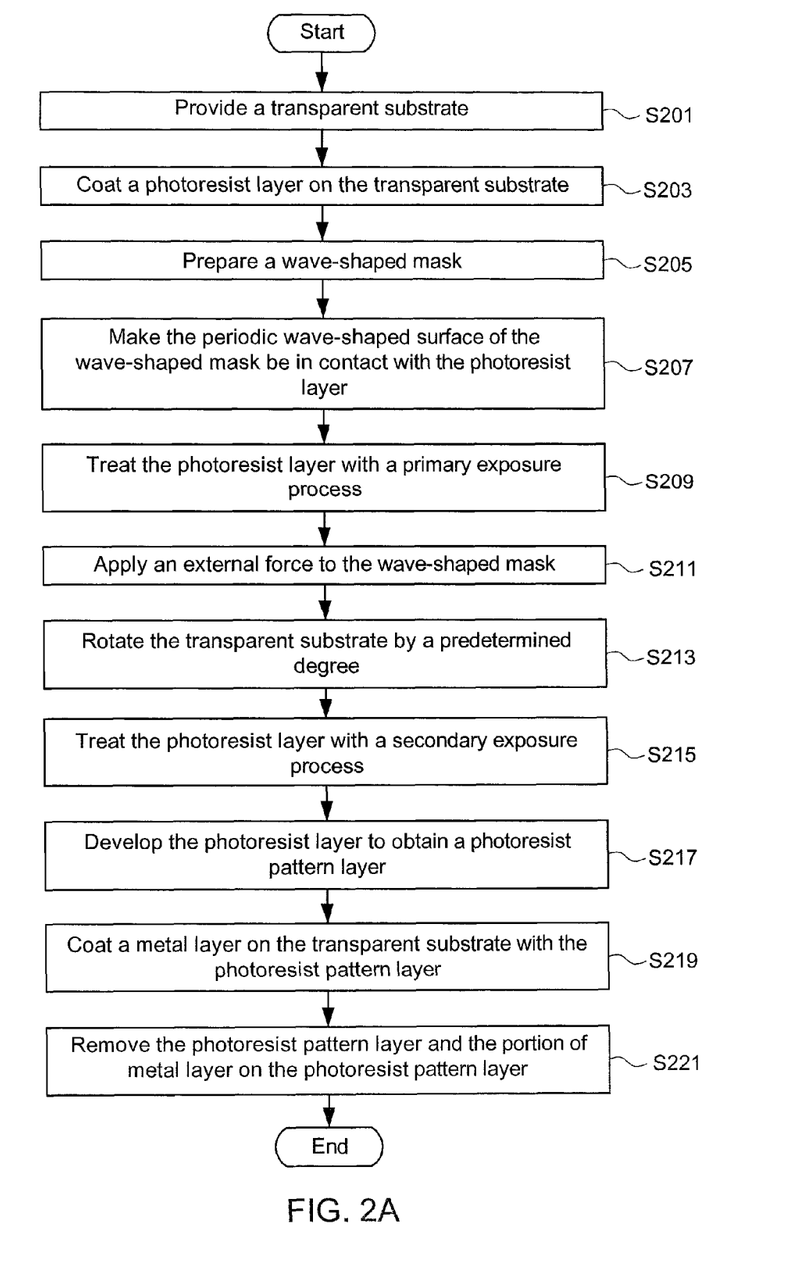
FIG. 2A is a flow chart of a process of fabricating the polarized color filter in accordance with an embodiment of the present disclosure.
Figure 2B:
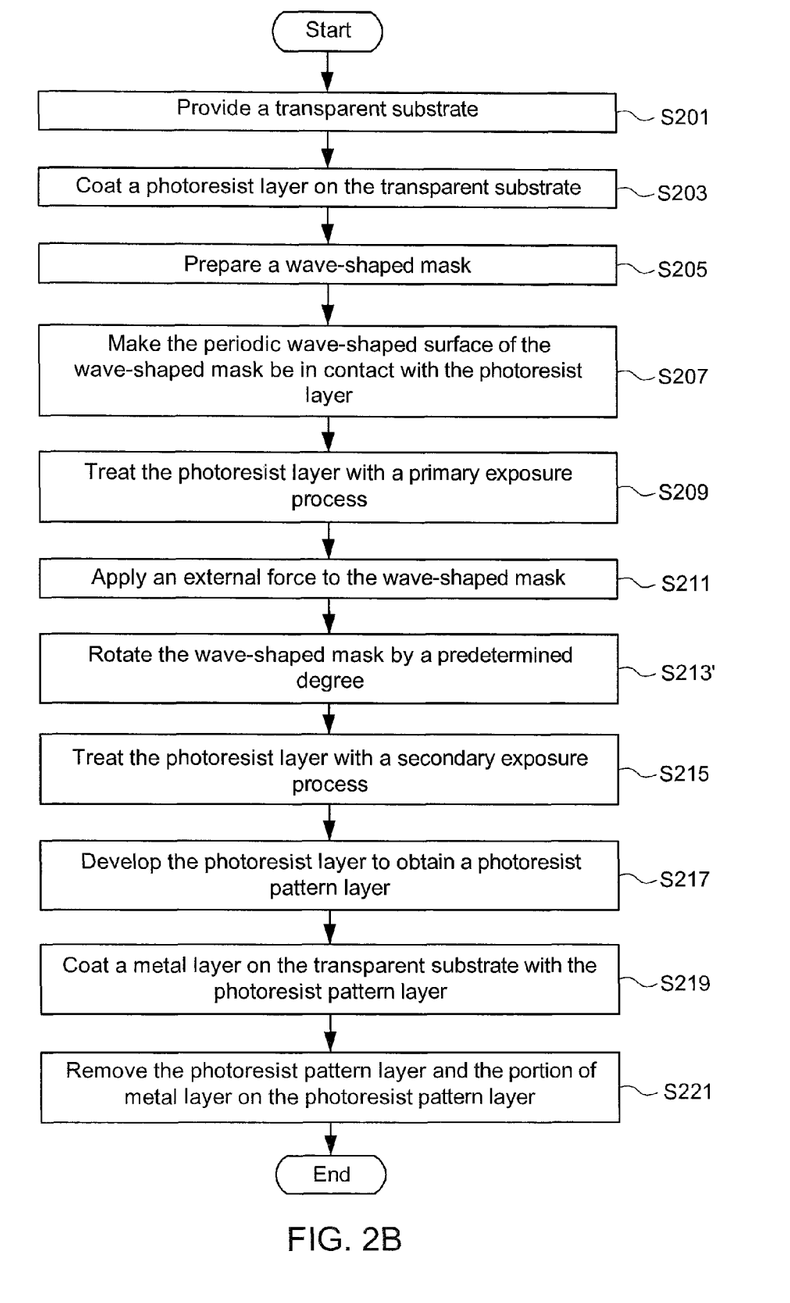
FIG. 2B is a flow chart of a process of fabricating the polarized color filter in accordance with an embodiment of the present disclosure.

FIG. 2B illustrates a flow chart of a process of fabricating the polarized color filter in accordance with an embodiment of the present disclosure. The fabrication process in accordance with this embodiment is generally the same as the fabrication process described in FIG. 2A. The fabrication process of this embodiment also uses the wave-shaped mask 15 to obtain the periodic hole structure 18. After the external force F is applied to the wave-shaped mask 15 (S211), the wave-shaped mask 15 is rotated about a central axis vertical to the wave-shaped mask 15 by a predetermined degree (S213'). The predetermined degree may be approximately equal to 90 degrees. Similarly, the process element of applying the external force F to the wave-shape mask 15 (S211) and the process element of rotating the wave-shape mask 15 (S213') may be swapped or performed at the same time. The same polarized color filter 10 is obtained in this embodiment.

Figure 3A:
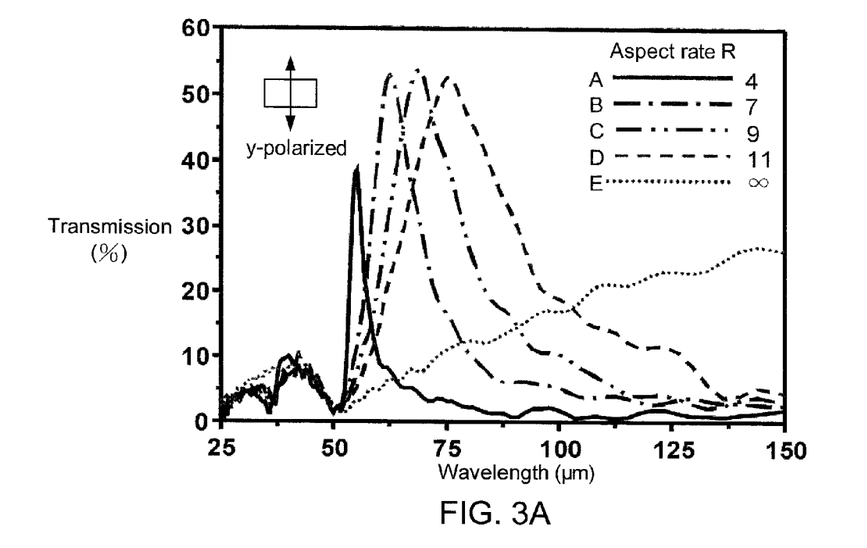
FIG. 3A is a y-polarized spectrogram of the polarized color filter in accordance with an embodiment of the present disclosure.
Figure 3B:
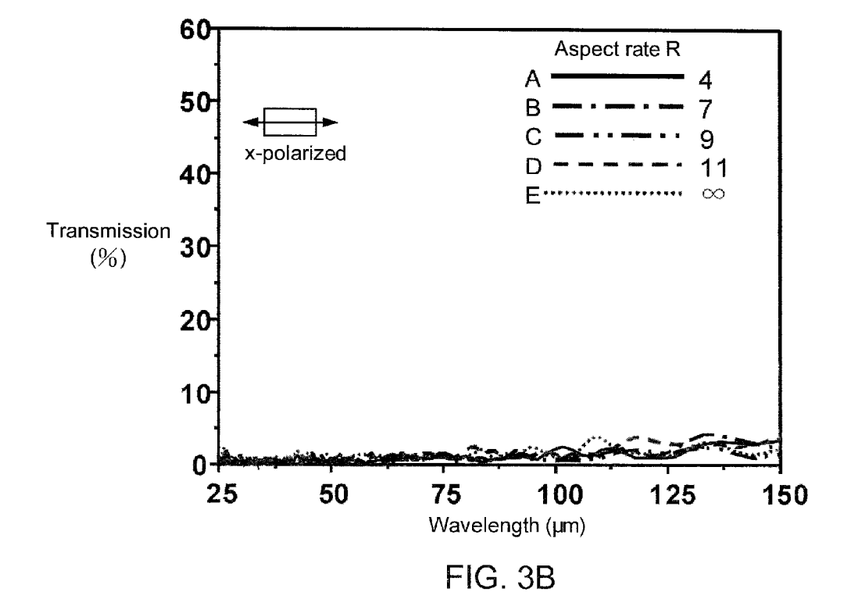
FIG. 3B is a x-polarized spectrogram of the polarized color filter in accordance with an embodiment of the present disclosure.

In conjunction with FIG. 1H, FIGS. 3A and 3B are a y-polarized and a x-polarized transmission spectrum of the polarized color filter in accordance with an embodiment of the present disclosure, respectively. The polarized color filter 10 is tested under a light source 12 parallel to z axis, where the light source 12 is unpolarized IR or visible light. The y-polarized transmission spectrum shows that the periodic hole structure 18 can filter various wavelengths of light under a different aspect ratio R $$\left(R = \frac{L}{W}\right).$$

The polarized color filter 10 thereby may be regarded as a filter.

As shown in FIG. 3A, the x-axis period $a_x'$ and the y-axis period $a_y'$ of the periodic rectangular hole structure 18 may be set to be 15 μm. The peaks of the of y-polarized transmitted spectrum may be increased gradually (for example, from 52 μm to 76 μm) with the increasing of the aspect ratio R (from R=4 to R=11). It reveals that the polarized color filter 10 can filter various wavelengths of light with a different aspect ratio R.

Similarly, the polarized color filter 10 may be tested under the light source 12 parallel to z-axis. The x-polarized transmission spectrum shows that the curves are relatively smooth regardless of the different aspect ratio R of the periodic rectangular hole structure 18, and the transmissions are less than 5%. It reveals that the x-polarized light cannot penetrate to the periodic rectangular hole structure 18. Thus it may be known that the polarized color filter 10 may polarize the unpolarized light 12 in a particular direction.

Overall, the present disclosure describes using the wave-shaped mask comprising two materials with different compression coefficient for photolithography directly rather than removing metal or other material. In particular, various periodic rectangular hole structures with different aspect rates may be obtained via the same wave-shaped mask after performing some processes to adjust the period of wave-shaped structure. The periodic rectangular hole structure can filter different wavelengths of light and polarize unpolarized light into polarized light. Thereby, the present disclosure may simplify complex photolithography procedures and reduce the manufactured cost and time. Additionally, a large area of periodic rectangular hole to structures may be mass-produced for use in the optoelectronic industry and biomedical industry, for example.

Realizations in accordance with the present disclosure have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the disclosure as defined in the claims that follow.

What is claimed is:

1. A method of fabricating a polarized color filter, comprising:
providing a transparent substrate, wherein the transparent substrate is coated with a photoresist layer;
preparing a wave-shaped mask, wherein the wave-shaped mask comprises a periodic wave-shaped surface and a plate-shaped surface opposite to the periodic wave-shaped surface, and the wave-shaped mask comprises an elastomeric transparent substrate and a light-penetrable thin film layer, in which the light-penetrable thin film layer is disposed on an upper surface of the elastomeric transparent substrate, and the light-penetrable thin film layer and the upper surface of the elastomeric transparent substrate are in periodic wave shape;
making the periodic wave-shaped surface be in contact with the photoresist layer;
treating the photoresist layer with a primary exposure process to obtain a first exposure zone;
applying an external force to the wave-shaped mask to deform the wave-shaped mask;
rotating the transparent substrate by a predetermined degree;
treating the photoresist layer with a secondary exposure process to obtain a second exposure zone;
developing the photoresist layer to obtain a photoresist pattern layer;
coating a metal layer on the transparent substrate with the photoresist pattern layer; and
removing the photoresist pattern layer and a portion of the metal layer on the photoresist pattern layer;
whereby the remaining metal layer forms a periodic hole structure.

2. The method according to claim 1, wherein the elastomeric transparent substrate comprises Polydimethylsiloxane or Polyimide.

3. The method according to claim 1, wherein the light penetrable thin film layer is a metal thin film layer or an oxide thin film layer.

4. The method according to claim 3, wherein the metal thin film layer comprises aurum (Au) or argentum (Ag).

5. The method according to claim 1, wherein the Young's modulus of the light penetrable thin film layer is larger than the Young's modulus of the elastomeric transparent substrate.

6. The method according to claim 1, wherein applying the external force to the wave-shaped mask comprises stretching the elastomeric transparent substrate along a horizontal axis.

7. The method according to claim 1, wherein applying the external force to the wave-shaped mask comprises pressing the elastomeric transparent substrate along a horizontal axis.

8. The method according to claim 1, wherein the metal layer comprises argentum (Ag), aurum (Au) or aluminum (Al).

9. The method according to claim 1, wherein the transparent substrate comprises a silicon (Si) wafer, a germanium (Ge) wafer or a glass substrate.

10. The method according to claim 1, wherein the photoresist pattern layer comprises a periodic rectangular hole structure.

11. The method according to claim 10, wherein the periodic hole structure comprises a rectangular hole structure.

12. The method according to claim 11, wherein a period of the periodic hole structure is between 300 nanometers and 30 micrometers.

13. The method according to claim 12, wherein a length of the rectangular hole structure is between 200 nanometers and 20 micrometers, and a width of the rectangular hole structure is between 50 nanometers and 20 micrometers.

14. A method of fabricating a polarized color filter, comprising:
providing a transparent substrate, wherein the transparent substrate is coated with a photoresist layer;
preparing a wave-shaped mask, wherein the wave-shaped mask comprises a periodic wave-shaped surface and a plate-shaped surface opposite to the periodic wave-shaped surface, and the wave-shaped mask comprises an elastomeric transparent substrate and a light-penetrable thin film layer, in which the light-penetrable thin film layer is disposed on an upper surface of the elastomeric transparent substrate, and the light-penetrable thin film layer and the upper surface of the elastomeric transparent substrate are in periodic wave shape;
making the periodic wave-shaped surface be in contact with the photoresist layer;
treating the photoresist layer with a primary exposure process to obtain a first exposure zone;
applying an external force to the wave-shaped mask to deform the wave-shaped mask;
rotating the wave-shaped mask by a predetermined degree;
treating the photoresist layer with a secondary exposure process to obtain a second exposure zone;
developing the photoresist layer to obtain a photoresist pattern layer;
coating a metal layer on the transparent substrate with the photoresist pattern layer; and
removing the photoresist pattern layer and a portion of the metal layer on the photoresist pattern layer;
whereby the remaining metal layer forms a periodic hole structure.

15. The method according to claim 14, wherein the elastomeric transparent substrate comprises Polydimethylsiloxane or Polyimide.

16. The method according to claim 14, wherein the light penetrable thin film layer comprises a metal thin film layer or an oxide thin film layer.

17. The method according to claim 16, wherein the metal thin film layer comprises aurum (Au) or argentums (Ag).

18. The method according to claim 14, wherein the Young's modulus of the light penetrable thin film layer is larger than the Young's modulus of the elastomeric transparent substrate.

19. The method according to claim 14, wherein applying the external force to the wave-shaped mask further comprises stretching the elastomeric transparent substrate along a horizontal axis.

20. The method according to claim 14, wherein applying the external force to the wave-shaped mask comprises pressing the elastomeric transparent substrate along a horizontal axis.

21. The method according to claim 14, wherein the metal layer comprises argentums (Ag), aurum (Au) or aluminum (Al).

22. The method according to claim 14, wherein the transparent substrate comprises a silicon (Si) wafer, a germanium (Ge) wafer or a glass substrate.

23. The method according to claim 14, wherein the photoresist pattern layer comprises a periodic rectangular hole structure.

24. The method according to claim 23, wherein the periodic hole structure comprises a rectangular hole structure.

25. The method according to claim 24, wherein a period of the periodic hole structure is between 300 nanometers and 30 micrometers.

26. The method according to claim 25, wherein a length of the rectangular hole structure is between 200 nanometers and 20 micrometers, and a width of the rectangular hole structure is between 50 nanometers and 20 micrometers.

* * * * *